United States Patent
Jain

(10) Patent No.: US 11,831,349 B2
(45) Date of Patent: Nov. 28, 2023

(54) SERIAL SIGNAL DETECTOR AND DIFFERENTIAL SIGNAL DETECTION METHOD COVERING MULTI-PROTOCOLS

(71) Applicant: FARADAY TECHNOLOGY CORPORATION, Hsinchu (TW)

(72) Inventor: Vinod Kumar Jain, Hsinchu (TW)

(73) Assignee: FARADAY TECHNOLOGY CORPORATION, Hsinchu (TW)

( * ) Notice: Subject to any disclaimer, the term of this patent is extended or adjusted under 35 U.S.C. 154(b) by 217 days.

(21) Appl. No.: 17/575,664

(22) Filed: Jan. 14, 2022

(65) Prior Publication Data
US 2023/0208459 A1 Jun. 29, 2023

(30) Foreign Application Priority Data
Dec. 23, 2021 (TW) ................................ 110148456

(51) Int. Cl.
*H04B 1/10* (2006.01)
*H03K 19/20* (2006.01)
*H03K 5/24* (2006.01)

(52) U.S. Cl.
CPC ............. *H04B 1/1018* (2013.01); *H03K 5/24* (2013.01); *H03K 19/20* (2013.01)

(58) Field of Classification Search
CPC ........ H04B 1/1018; H03K 5/24; H03K 19/20; H03K 5/1252; Y02D 10/00
See application file for complete search history.

(56) References Cited

U.S. PATENT DOCUMENTS

| | | |
|---|---|---|
| 8,432,981 B1 | 4/2013 | An et al. |
| 9,490,791 B2 | 11/2016 | Liu et al. |
| 2002/0075012 A1 | 6/2002 | Tang et al. |
| 2010/0109795 A1* | 5/2010 | Jones ............... G09G 5/006 333/101 |
| 2013/0307525 A1* | 11/2013 | Chen ................ G01R 17/10 324/101 |
| 2015/0358011 A1 | 12/2015 | Tang et al. |

OTHER PUBLICATIONS

Office Action issued by TIPO dated Aug. 18, 2022.

* cited by examiner

*Primary Examiner* — Vineeta S Panwalkar
(74) *Attorney, Agent, or Firm* — WPAT, P.C.

(57) ABSTRACT

A serial signal detector and a differential signal detection method are provided. The serial signal detector includes a voltage comparison module and a hybrid logic filter. The voltage comparison module receives a differential signal, including a first shifted signal and a second shifted signal. The voltage comparison module includes a first comparator and a second comparator. Based on the first shifted signal, the second shifted signal, and a voltage threshold, the first and the second comparators respectively generate a first and a second comparison signals. The hybrid logic filter includes a controllable logic gate and a capacitor. The controllable logic gate performs a logic operation related to the first and the second comparison signals and generates a filtered and converted pulse accordingly. The controllable logic gate and the capacitor jointly perform a preliminary filtering operation to the filtered and converted pulse while the logic operation is being performed.

20 Claims, 9 Drawing Sheets

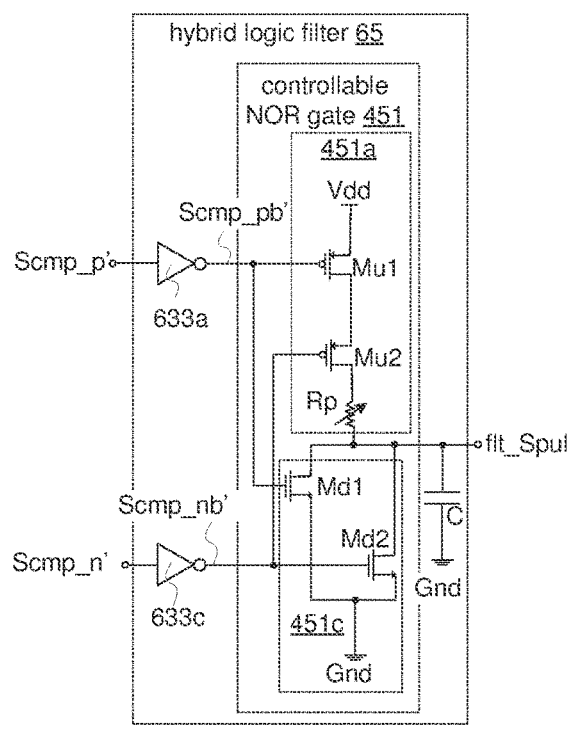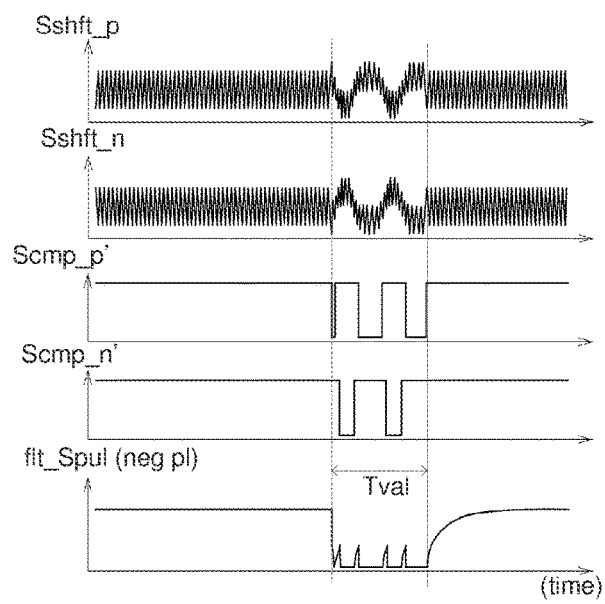
FIG. 8A
FIG. 8B

SERIAL SIGNAL DETECTOR AND DIFFERENTIAL SIGNAL DETECTION METHOD COVERING MULTI-PROTOCOLS

This application claims the benefit of Taiwan application Serial No. 110148456, filed Dec. 23, 2021, the subject matter of which is incorporated herein by reference.

TECHNICAL FIELD

The disclosure relates in general to a serial signal detector and a differential signal detection method, and more particularly to a serial signal detector and a differential signal detection method covering multi-protocols.

BACKGROUND

Serial transmission technology has been widely used in electronic devices, and serial signal detection is essential in serial signal protocols. Different communication protocols, such as squelch detection in PCIe, out of band (hereinafter, OOB) detection in serial advanced technology attachment (hereinafter, SATA), low-frequency periodic signaling (hereinafter, LFPS) detection in universal serial bus (hereinafter, USB), loss of signal (hereinafter, LOS) detection in Ethernet, and so forth, have different specifications and define various criteria for signal detection in terms of voltage, range of signal swing, frequency, pattern, etc.

FIG. 1 is a schematic diagram illustrating the signal detection scheme of a conventional receiver. With the development of portable devices, the electronic device needs to include different serial signal detectors to cover multiple protocols. Please note that, for illustration purposes, only two serial signal detectors 10a, 10b are shown in FIG. 1.

The conventional receiver 1 includes serial signal detectors 10a, 10b, and a main circuit 12. The serial signal detectors 10a, 10b are respectively electrically connected to the main circuit 12.

The operations of the serial signal detectors 10a, 10b are similar. The serial signal detector 10a performs a differential signal detection operation for generating a detected signal Sdeta based on the positive input signal Sina_p and the negative input signal Sina_n. The serial signal detector 10b performs a differential signal detection operation for generating another detected signal Sdetb based on the positive input signal Sinb_p and the negative input signal Sinb_n. Then, the serial signal detectors 10a, 10b respectively transmit the detected signals Sdeta, Sdetb to the main circuit 12. The main circuit 12 utilizes the detected signals Sdeta, Sdetb to proceed with further operations. For example, the main circuit 12 can be a serializer/de-serializer (hereinafter, SerDes) circuit which performs SERDES operation in response to the detected signals Sdeta, Sdetb.

As shown in FIG. 1, for the electronic device supporting multiple serial communication protocols, the conventional receiver 1 needs to provide several serial signal detectors 10a, 10b. Consequentially, the more serial communication protocols the electronic device supports, the more serial signal detectors are needed. However, the implementation of several serial signal detectors 10a, 10b needs more area, and the main circuit 12 needs more pins to set the serial signal detectors 10a, 10b. In short, the cost of separate serial signal detectors 10a, 10b is high.

SUMMARY

The disclosure is directed to a serial signal detector and a differential signal detection method applied to the receiver. The serial signal detector and the differential signal detection method can cover different serial communication protocols.

According to one embodiment, a serial signal detector is provided. The serial signal detector includes a voltage comparison module and a hybrid logic filter. The voltage comparison module receives a pair of differential signals including a first shifted signal and a second shifted signal. The voltage comparison module includes a first comparator and a second comparator. The first comparator generates a first comparison signal based on the first shifted signal, the second shifted signal, and a voltage threshold. The second comparator generates a second comparison signal based on the first shifted signal, the second shifted signal, and the voltage threshold. The hybrid logic filter is electrically connected to the first comparator and the second comparator. The hybrid logic filter includes a controllable logic gate and a capacitor. The controllable logic gate performs a logic operation related to the first comparison signal and the second comparison signal and generates a filtered and converted pulse accordingly. The capacitor is electrically connected to the controllable logic gate. The controllable logic gate and the capacitor jointly perform a preliminary filtering operation to the filtered and converted pulse while the logic operation is being performed.

According to another embodiment, a signal detection method applied to a receiver is provided. The signal detection method includes the following steps. Firstly, a pair of differential signals, including a first shifted signal and a second shifted signal, is received. Then, a first comparison signal and a second comparison signal are generated based on the first shifted signal, the second shifted signal, and a voltage threshold. A logic operation related to the first comparison signal and the second comparison signal is performed. A filtered and converted pulse is generated in response to the logic operation. Moreover, a preliminary filtering operation is performed on the filtered and converted pulse while the logic operation is being performed.

BRIEF DESCRIPTION OF THE DRAWINGS

FIG. 8A is a schematic diagram illustrating an exemplary the hybrid logic filter.

FIG. 8B is a waveform diagram illustrating the signals related to the hybrid logic filter in FIG. 8A.

Figure 1:
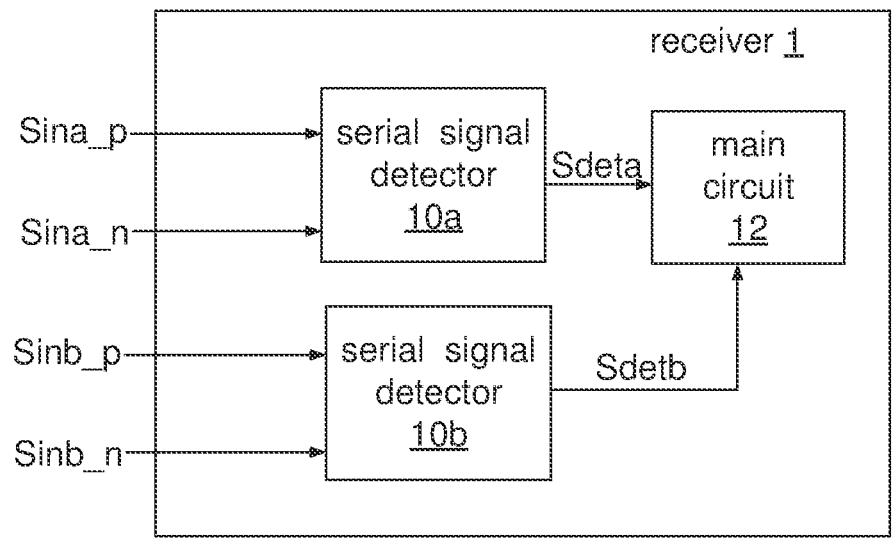
FIG. 1 (prior art) is a schematic diagram illustrating the signal detection scheme of a conventional receiver.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the specification, a unified serial signal detector capable of covering different serial communication protocols is provided. The serial signal detector includes components that can be dynamically set in response to the serial communication protocol being selected.

Figure 2:
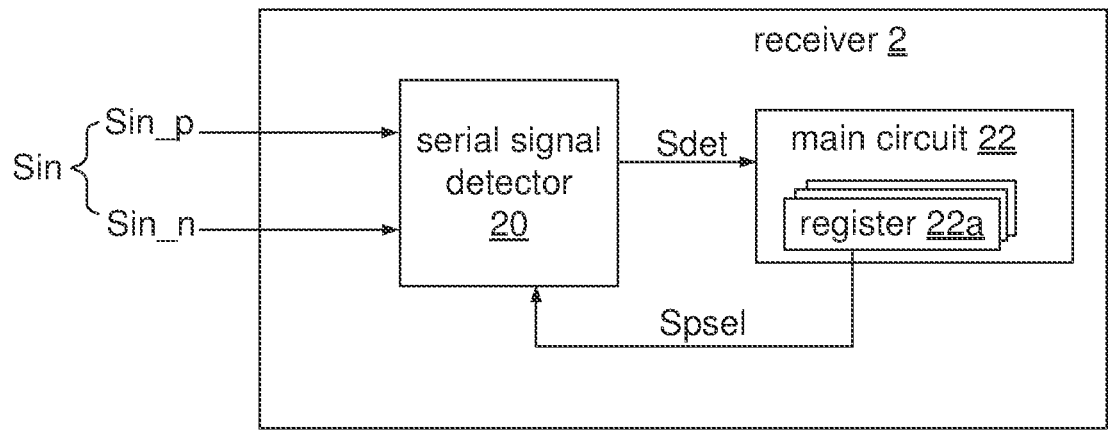
FIG. 2 is a schematic diagram illustrating the signal detection scheme of a receiver according to the embodiment of the present disclosure.

FIG. 2 is a schematic diagram illustrating the signal detection scheme of a receiver according to an embodiment of the present disclosure. The receiver 2 includes a serial signal detector 20 and a main circuit 22. The serial signal detector 20 is electrically connected to the main circuit 22.

The main circuit 22 may include registers 22a, whose values are dynamically set in response to the serial communication protocol being selected by the user. According to the values being set at the registers 22a, the main circuit 22 transmits a protocol selection signal Spsel to the serial signal detector 20. The protocol selection signal Spsel is register programmed and utilized to inform the serial signal detector 20 regarding which of the serial communication protocol is selected. Depending on the protocol selection signal Spsel, the serial signal detector 20 changes its internal settings to match the protocol-specific criteria.

The serial signal detector 10 receives a pair of differential input signals Sin, including a positive input signal Sin_p and a negative input signal Sin_n. The positive input signal Sin_p and a negative input signal Sin_n may correspond to any of the differential signals defined in serial communication protocols. Based on the positive input signal Sin_p and the negative input signal Sin_n, the serial signal detector 20 generates a detected signal Sdet. Then, the detected signal Sdet is transmitted to the main circuit 22. As shown in FIG. 2, the receiver 2 needs only one serial signal detector 20. Compared with the receiver 1 in FIG. 1, the cost of receiver 2 can be decreased dramatically. Besides, as fewer circuits are required, the loading at the input nodes of the receiver 2 is less, and the bandwidth of input nodes of the receiver 2 is not limited.

Figure 3:
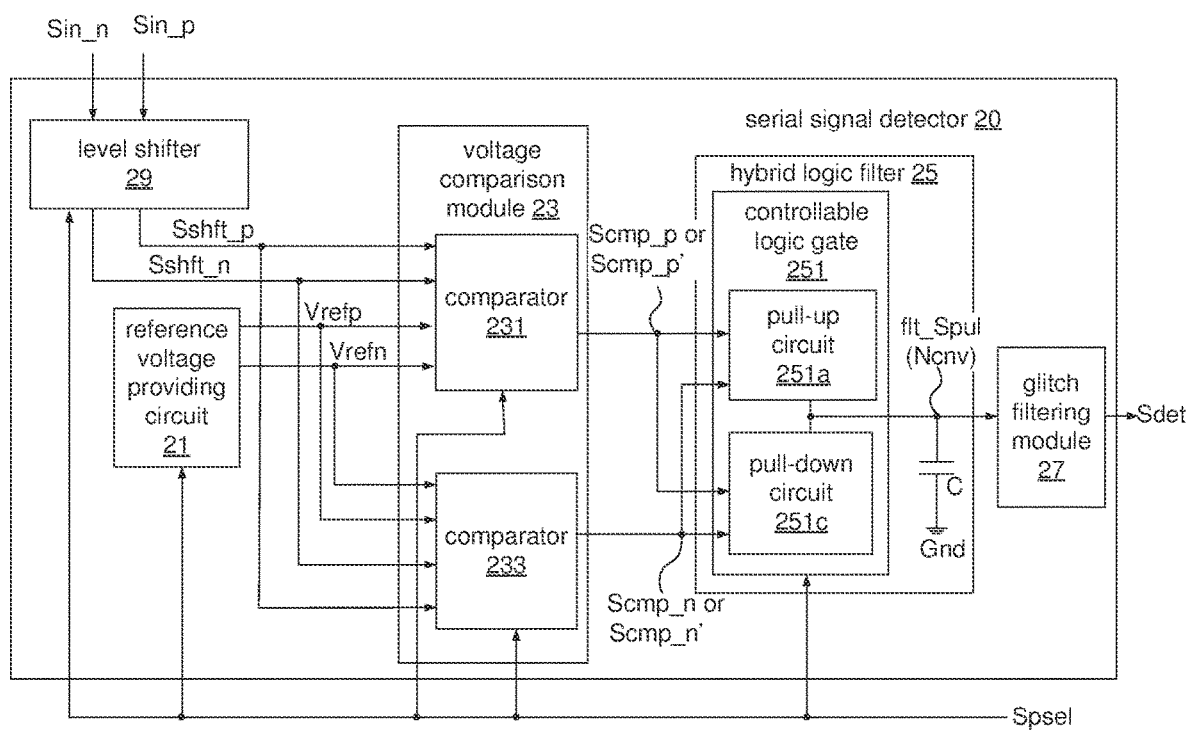
FIG. 3 is a block diagram illustrating signals and components of the serial signal detector according to the embodiment of the present disclosure.

FIG. 3 is a block diagram illustrating signals and components of the serial signal detector according to the embodiment of the present disclosure. The serial signal detector 20 includes a level shifter 29, a reference voltage providing circuit 21, a voltage comparison module 23, a hybrid logic filter 25, and a glitch filtering module 27.

The level shifter 29 receives the positive input signal Sin_p and the negative input signal Sin_n. Then, the level shifter 29 shifts a common-mode voltage of the positive input signal Sin_p and the negative input signal Sin_n. After being shifted, a positive shifted signal Sshft_p is generated based on the positive input signal Sin_p, and a negative shifted signal Sshft_n is generated based on the negative input signal Sin_n.

The reference voltage providing circuit 21 provides a positive reference voltage Vrefp and a negative reference voltage Vrefn to the voltage comparison module 23. The positive reference voltage Vrefp and the negative reference voltage Vrefn are constant direct current (hereinafter, DC) voltages, and the positive reference voltage Vrefp is higher than the negative reference voltage Vrefn. A voltage threshold Vth representing a difference between the positive reference voltage Vrefp and the negative Vrefn is defined in the specification. That is, Vth=(Vrefp−Vrefn).

In addition to the positive reference voltage Vrefp and the negative reference voltage Vrefn, the comparators 231, 233 simultaneously receive the positive shifted signal Sshft_p and the negative shifted signal Sshft_n. The comparator 231 generates and transmits a positive comparison signal Scmp_p to the hybrid logic filter 25. The comparator 233 generates and transmits a negative comparison signal Scmp_n to the hybrid logic filter 25.

In the specification, a voltage difference (Sshft_p−Sshft_n) between the positive shifted signal Sshft_p and the negative shifted signal Sshft_n is defined as a positive voltage difference ΔVshft_pn, and a voltage difference (Sshft_n−Sshft_p) between the negative shifted signal Sshft_n and the positive shifted signal Sshft_p is defined as a negative voltage difference ΔVshft_np. That is, ΔVshft_pn=(Sshft_p−Sshft_n), and ΔVshft_np=(Sshft_n−Sshft_p). According to the definitions, the positive voltage difference ΔVshft_pn and the negative voltage difference ΔVshft_np have equivalent magnitudes but opposite signs.

A positive-path comparison condition corresponding to the comparator 231 is defined based on comparing the voltage threshold Vth and the positive voltage difference ΔVshft_pn. When the positive voltage difference ΔVshft_pn is greater than the voltage threshold Vth (that is, ΔVshft_pn>Vth), the positive-path comparison condition is satisfied, and the comparator 231 sets the positive comparison signal Scmp_p to a predefined level (for example, high level H). Alternatively, when the positive voltage difference ΔVshft_pn is smaller than or equivalent to the voltage threshold Vth (that is, ΔVshft_pn≤Vth), the positive-path comparison condition is not satisfied, and the comparator 231 sets the positive comparison signal Scmp_p to another predefined level (for example, low level L).

A negative-path comparison condition corresponding to the comparator 233 is defined based on comparing the voltage threshold Vth and the negative voltage difference ΔVshft_np. When the negative voltage difference ΔVshft_np is greater than the voltage threshold Vth (that is, ΔVshft_np>Vth), the negative-path comparison condition is satisfied, and the comparator 233 sets the negative comparison signal Scmp_n to a predefined level (for example, high level H). Alternatively, when the negative voltage difference ΔVshft_np is smaller than or equivalent to the voltage threshold Vth (that is, ΔVshft_np≤Vth), the negative-path comparison condition is not satisfied, and the comparator 233 sets the negative comparison signal Scmp_n to another predefined level (for example, low level L).

The selections of the predefined levels of the positive comparison signal Scmp_p regarding whether the positive-path comparison condition is satisfied or not are dependent on practical applications. Similarly, the selections of the predefined levels of the negative comparison signal Scmp_p regarding whether the negative-path comparison condition is satisfied or not are dependent on practical applications. Table 1 lists two possible combinations of the predefined levels regarding satisfaction of the positive-path/negative-path comparison conditions. Nevertheless, different selections and combinations of the predefined levels might be adopted in other applications.

TABLE 1

| comparison result | | predefined levels of positive/negative comparison signal | |
|---|---|---|---|
| | | Scmp_p/Scmp_n (in FIGS. 6A, 6B, 7A, 7B) | Scmp_p'/Scmp_n' (in FIGS. 8A, 8B, 9A, 9B) |
| positive-path comparison condition ($\Delta Vshft\_pn > Vth$) | satisfied not satisfied | Scmp_p = H Scmp_p = L | Scmp_p' = L Scmp_p' = H |
| negative-path comparison condition ($\Delta Vshft\_np > Vth$) | satisfied not satisfied | Scmp_n = H Scmp_n = L | Scmp_n' = L Scmp_n' = H |

Two types of embodiments are illustrated below. For the embodiments in FIGS. 6A, 6B, 7A, and 7B, the comparators 231, 233 respectively set the positive comparison signal Scmp_p and the negative comparison signal Scmp_n to the high level (Scmp_p=H, Scmp_n=H) if their corresponding comparison conditions are satisfied, and vice versa. As for embodiments in FIGS. 8A, 8B, 9A, and 9B, the predefined levels of the positive comparison signal Scmp_p and the negative comparison signal Scmp_n corresponding to the positive-path/negative-path comparison condition are opposite those in FIGS. 6A, 6B, 7A, and 7B. Please note that the design of the hybrid logic filter 25 should be modified adequately in response to such differences.

The hybrid logic filter 25 further includes a controllable logic gate 251 and a capacitor C. The controllable logic gate 251 includes a pull-up circuit 251a and a pull-down circuit 251c. The hybrid logic filter 25 performs a logic operation (for example, NOR operation, OR operation, AND operation, NAND operation, and so forth). Moreover, the hybrid logic filter 25 and the capacitor C jointly perform a preliminary filtering operation. The logic operation and the preliminary filtering operation are performed simultaneously. As the hybrid logic filter 25 is a digital-based circuit, the area required for filtering can be minimized. Then, the hybrid logic filter 25 generates a filtered and converted pulse flt_Spul at a pulse conversion terminal Ncnv. The filtered and converted pulse flt_Spul is transmitted to the glitch filtering module 27. Later, the glitch filtering module 27 performs a secondary glitch filtering to the filtered and converted pulse flt_Spul and generates a detected signal Sdet accordingly. Then, the glitch filtering module 27 transmits the detected signal Sdet to the main circuit 22.

The protocol selection signal Spsel representing the serial communication protocol being selected is transmitted to the level shifter 29, the reference voltage providing circuit 21, the comparators 231, 233, and the controllable logic gate 251. According to the protocol selection signal Spsel, the level shifter 29, the reference voltage providing circuit 21, the comparators 231, 233, and the controllable logic gate 251 dynamically adjust their internal settings (such as voltage values, threshold values, resistance values, capacitance values, and so forth), to perform the signal detection operation corresponding to the selected serial communication protocol.

Figure 4A:
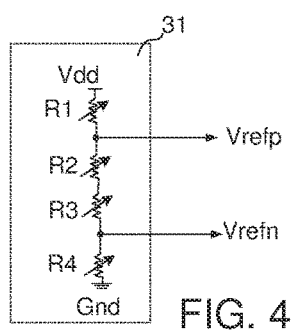
FIGS. 4A and 4B are schematic diagrams illustrating the exemplary implementations of the reference voltage providing circuit.
Figure 4B:
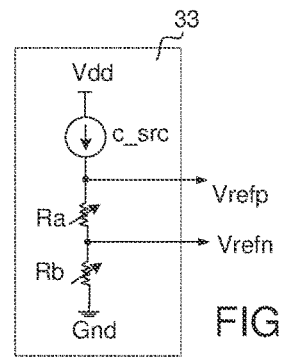

FIGS. 4A and 4B are schematic diagrams illustrating the exemplary implementations of the reference voltage providing circuit. In FIG. 4A, the reference voltage providing circuit 31 is implemented with a voltage divider. The voltage divider includes resistors R1, R2, R3, R4. The resistance values of the resistors R1, R2, R3, R4 can be freely set in response to the protocol selection signal Spsel. In FIG. 4B, the reference voltage providing circuit 33 is implemented with a current source c_src and resistors Ra, Rb. The current value of the current source c_src and the resistance values of the resistors Ra, Rb can be freely selected in response to the protocol selection signal Spsel.

In the specification, a supply voltage terminal and its voltage (supply voltage) are represented with the same symbol, Vdd; a ground terminal and its voltage (ground voltage) are represented with the same symbol, Gnd. The supply voltage Vdd is higher than the ground voltage Gnd (Vdd>Gnd). As shown in FIGS. 4A and 4B, the voltage values of the supply voltage Vdd, the positive reference voltage Vrefp, and the negative reference voltage Vref can be freely selected and set according to the requirement of the serial communication protocols. Moreover, the reference voltage providing circuit 21 can be implemented with other circuit designs.

The positive reference voltage Vrefp and the negative reference voltage Vrefn can be conducted from an external circuit outside the serial signal detector. For the sake of illustration, the level shifter and the reference voltage providing circuit are omitted in the following embodiments.

Figure 5:
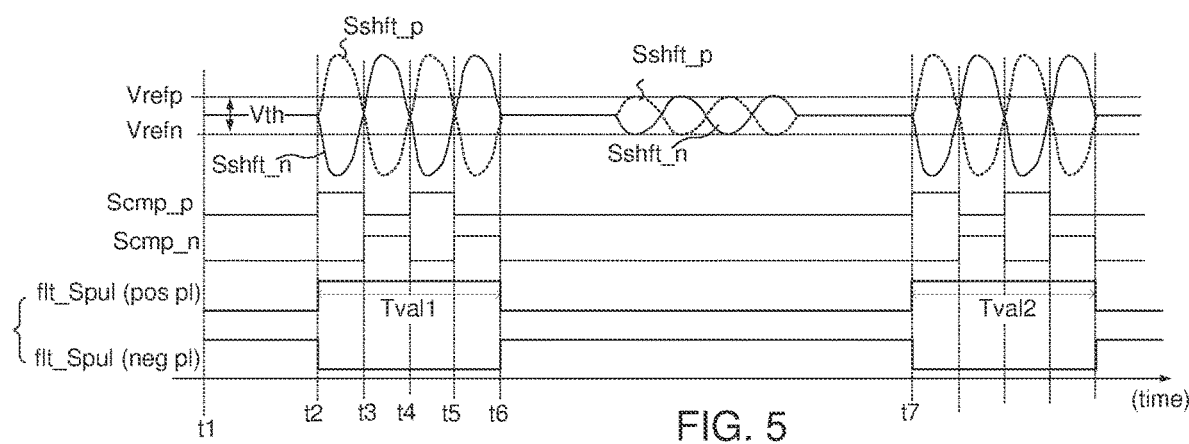
FIG. 5 is a waveform diagram illustrating the input and output signals of the serial signal detector.

FIG. 5 is a waveform diagram illustrating the input and output signals of the serial signal detector. At the top of FIG. 5, the dotted waveform represents the positive shifted signal Sshft_p, and the solid waveform represents the negative shifted signal Sshft_n. FIG. 5 further includes a waveform representing the positive comparison signal Scmp_p, a waveform representing the negative comparison signal Scmp_n, and waveforms flt_Spul (pos pl), flt_Spul (neg pl) representing the filtered and converted pulse. In the specification, the waveform flt_Spul (pos pul) represents the filtered and converted pulse having a positive pulse(s), and the waveform flt_Spul (neg pul) represents the filtered and converted pulse having a negative pulse(s).

As shown in FIG. 5, the waveforms flt_Spul (pos pl), flt_Spul (neg pl) are complement. The output of the hybrid logic filter 25 can be represented by either of the waveforms flt_Spul (pos pl), flt_Spul (neg pl), depending on the design of the comparators 231, 233, and the controllable logic gate 251.

Changes of the waveforms corresponding to the positive comparison signal Scmp_p, the negative comparison signal Scmp_n, and the filtered and converted pulse flt_Spul (pos pul), flt_Spul (neg pul) are summarized in Table 2, in chronological order.

TABLE 2

| duration | positive comparison signal Scmp_p | negative comparison signal Scmp_n | filtered and converted pulse flt_Spul (pos pul) | filtered and converted pulse flt_Spul (neg pul) | type of duration |
|---|---|---|---|---|---|
| t1-t2 | L | L | L | H | nonvalid signal duration |
| t2-t3 | H | L | H | L | valid signal duration |
| t3-t4 | L | H | H | L | |
| t4-t5 | H | L | H | L | |
| t5-t6 | L | H | H | L | |
| t6-t7 | L | L | L | H | nonvalid signal duration |

The waveforms between time point t1 to time point t7 have been listed above. As the waveform relationships after time point t7 are analog to those described above, they are not explained. In FIG. 5, the valid signal durations Tval1, Tval2 represent the durations when any of the positive-path and the negative-path comparison conditions is satisfied. During valid signal durations Tval1, Tval2, the filtered and converted pulse having the positive pulse flt_Spul (pos pul)=H or the filtered and converted pulse having the negative pulse flt_Spul (neg pul)=L is formed at the pulse conversion terminal Ncnv. The nonvalid signal durations represent the duration when both the positive-path and negative-path comparison conditions are not satisfied. The lengths of different valid signal durations Tval1, Tval2 are not necessary to be equivalent.

Theoretically speaking, the filtered and converted pulse flt_Spul (pos pul), flt_Spul (neg pul) can be directly transmitted to the main circuit. However, in practical applications, the operation speed of the comparators 231, 233 might not be fast enough, and/or the positive/negative shifted signals Sshft_p, Sshft_n might have some margin values in transition. Consequentially, changes of the positive shifted signal Sshft_p and the negative shifted signal Sshft_n cannot be reacted in a real-time manner, and the filtered and converted pulse flt_Spul (pos pul), flt_Spul (neg pul) might not be continuously smooth during the valid signal durations Tval1, Tval2. In other words, the filtered and converted pulse flt_Spul (pos pul), flt_Spul (neg pul) during the valid signal duration Tval1, Tval2 might not be a constant level but have some minor variations. Moreover, the minor variations of the filtered and converted pulse flt_Spul occurred in the gap durations are undesired and considered glitches. That is, during the minor variations, the filtered and converted pulse flt_Spul is not equivalent to a consistent voltage (Vdd/Gnd). Instead, the filtered and converted pulse flt_Spul has an intermediate voltage Vm between the ground voltage Gnd and the supply voltage Vdd (Gnd<Vm<Vdd).

In the specification, the controllable logic gate 251 is inherently merged with a preliminary filter operation, and the glitch filtering module 27 is utilized to provide secondary filter operations. Then, after the glitches are filtered, the glitch filtering module 27 generates and transmits the digitalized detected signal Sdet to the main circuit 22.

Figure 6A:
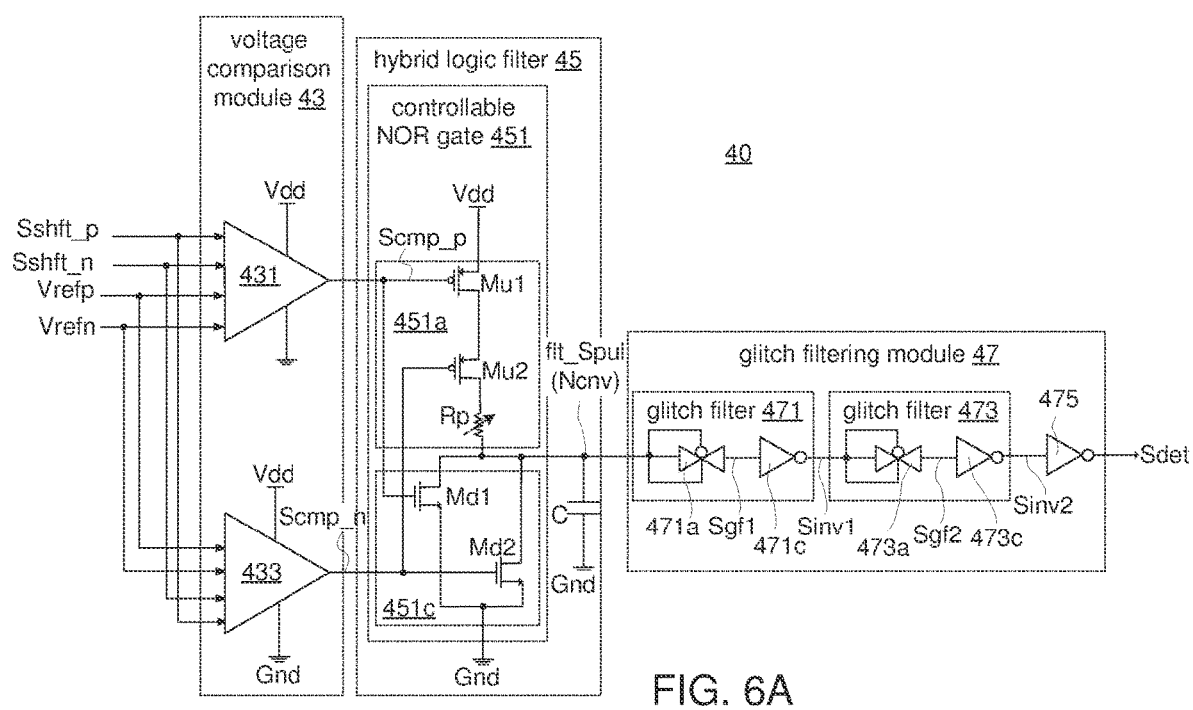
FIG. 6A is a schematic diagram illustrating an embodiment of the serial signal detector.

FIG. 6A is a schematic diagram illustrating an embodiment of the serial signal detector. The serial signal detector 40 includes a voltage comparison module 43, a hybrid logic filter 45, and a glitch filtering module 47.

The voltage comparison module 43 includes comparators 431, 433. The comparators 431, 433 respectively generate the positive comparison signal Scmp_p and the negative comparison signal Scmp_n. In FIG. 6, the hybrid logic filter 55 includes a controllable NOR gate 451 and a capacitor C. The controllable NOR gate 451 further includes a pull-up circuit 451a and a pull-down circuit 451c.

The pull-up circuit 451a includes PMOS transistors Mu1, Mu2 (pull-up transistors) and a programmable resistor Rp, and the pull-down circuit 451c includes NMOS transistors Md1, Md2 (pull-down transistors). The programmable resistor Rp is electrically connected to the pull-down circuit 451c and the capacitor C. The pull-up circuit 451a provides a pull-up path for conducting the supply voltage Vdd to the pulse conversion terminal Ncnv. The pull-down circuit 451c provides a pull-down path for conducting the ground voltage Gnd to the pulse conversion terminal Ncnv.

In the pull-up circuit 451a, the source terminal of PMOS transistor Mu1 is electrically connected to the supply voltage terminal Vdd, and the drain terminal of PMOS transistor Mu1 is electrically connected to the source terminal of PMOS transistor Mu2. The drain terminal of PMOS transistor Mu2 is electrically connected to the resistor Rp. The gate terminals of the PMOS transistors Mu1, Mu2 are respectively electrically connected to the comparators 431, 433. The PMOS transistor Mu1 is controlled by the positive comparison signal Scmp_p, the output of the comparator 431. The PMOS transistor Mu2 is controlled by the negative comparison signal Scmp_n, the output of the comparator 433.

As the PMOS transistors Mu1, Mu2 are connected in serial, the filtered and converted pulse flt_Spul is pulled to the supply voltage Vdd when both of the PMOS transistors Mu1, Mu2 are switched on (ON). When any PMOS transistors Mu1, Mu2 is switched off (OFF), the pull-up path is disconnected, and the filtered and converted pulse flt_Spul is determined by the pull-down path.

In the pull-down circuit 451c, the source terminals of the NMOS transistors Md1, Md2 are electrically connected to the ground terminal Gnd, and the drain terminals of the NMOS transistors are electrically connected to the programmable resistor Rp and the capacitor C. The gate terminals of the NMOS transistors Md1, Md2 are respectively electrically connected to the comparators 431, 433. The NMOS transistor Md1 is controlled by the positive comparison signal Scmp_p, the output of the comparator 431. The NMOS transistor Md2 is controlled by the negative comparison signal Scmp_n, the output of the comparator 433.

As the NMOS transistors Md1, Md2 are connected in parallel, the filtered and converted pulse flt_Spul is pulled to the ground voltage Gnd when any of the NMOS transistors Md1, Md2 is switched on (ON). When both the NMOS transistors Md1, Md2 are switched off (OFF), the pull-down path is disconnected, and the filtered and converted pulse flt_Spul is determined by the pull-up path.

Table 3 summarizes the operations related to the hybrid logic filter 45. In Table 3, different combinations of the input of the controllable NOR gate 451, switching statuses (ON/OFF) of the PMOS transistors Mu1, Mu2 and the NMOS transistors Md1, Md2, and the output of the hybrid logic filter 45 are listed.

TABLE 3

| inputs of controllable NOR gate | | PMOS transistors in pull-up path | | NMOS transistors in pull-down path | | output of hybrid logic filter 45 | transistor related to |
| --- | --- | --- | --- | --- | --- | --- | --- |
| Scmp_p | Scmp_n | Mu1 | Mu2 | Md1 | Md2 | flt_Spul | flt_Spul |
| L | L | ON | ON | OFF | OFF | H (Vdd) | Mu1 + Mu2 |
| L | H | ON | OFF | OFF | ON | L (Gnd) | Md2 |
| H | L | OFF | ON | ON | OFF | L (Gnd) | Md1 |
| H | H | OFF | OFF | ON | ON | L (Gnd) | Md1 + Md2 |

Table 3 shows that the ground voltage Gnd is conducted to the pulse conversion terminal Ncnv (filtered and converted pulse flt_Spul=Gnd) when at least one of the positive comparison signal Scmp_p and the negative comparison signal Scmp_n is set to the high level (Scmp_p=H and/or Scmp_n=H). Moreover, the supply voltage Vdd is conducted to the pulse conversion terminal Ncnv (filtered and converted pulse flt_Spul=Vdd) when both the positive comparison signal Scmp_p and the negative comparison signal Scmp_n are set to the low level (Scmp_p=Scmp_n=L). Therefore, PMOS transistors M1, M2, and NMOS transistors M3, M4 jointly provide a NOR operation. Besides, please note that the positive comparison signal Scmp_p and the negative comparison signal Scmp_n cannot be set to the high level (Scmp_p=Scmp_n=H) at the same time in practical applications because the positive-path comparison condition (ΔVshft_pn>Vth) and the negative-path comparison condition (ΔVshft_np>Vth) cannot be satisfied simultaneously based on their definitions.

The programmable resistor Rp can slow down the transient speed of the filtered and converted pulse flt_Spul. Once the transient speed of the filtered and converted pulse flt_Spul slows down, the glitches can be suppressed accordingly. The resistance value of the programmable resistor Rp needs to be selected to match the specification requirement. For example, in USB and SATA specifications, maximum and minimum pulse widths of the detected signal Sdet are defined. As the programmable resistor Rp regulates the charging speed of the filtered and converted pulse flt_Spul, the pulse width of the detected signal Sdet is affected accordingly.

When the programmable resistor Rp has a greater resistance value, the glitches of the filtered and converted pulse flt_Spul are filtered out, and the filtered and converted pulse flt_Spul has a narrower pulse width. On the other hand, when the programmable resistor Rp has a smaller resistance value, glitches of the filtered and converted pulse flt_Spul cannot be filtered out, and the filtered and converted pulse flt_Spul has a wider pulse width.

Therefore, although the programmable resistor Rp with a greater resistance value can smooth the glitches better, the resistance value of the programmable resistor Rp is preferred not to be too big to avoid slowing down the charging speed of the filtered and converted pulse flt_Spul. Alternatively speaking, the selection of the resistance value of the programmable resistor Rp needs to concern both the glitch suppressing and the charging speed. The considerations about selecting the resistance value of the programmable resistor Rp are listed in Table 4.

TABLE 4

| resistance value of programmable resistor Rp | glitch suppressing | charging speed |
| --- | --- | --- |
| greater | better | slower (flt_Spu increases slower so that fewer glitches occur) |
| smaller resistance value | worse | faster (flt_Spu increases faster so that more glitches occur) |

As illustrated above, the hybrid logic filter 45 generates the filtered and converted pulse flt_Spul in response to the positive comparison signal Scmp_p and the negative comparison signal Scmp_n. Besides, during the valid signal duration Tval, the filtered and converted pulse flt_Spul may include glitches that must be removed before providing to the main circuit.

In FIG. 6A, the glitch filtering module 47 includes glitch filters 471, 473, and an output inverter 475. The glitch filters 471, 473 are utilized to filter out the glitches in the filtered and converted pulse flt_Spul. Each glitch filter 471, 473 includes a transmission gate 471a, 473a, and an inverter 471c, 473c. In practical applications, the number of the glitch filters 471, 473 and the number of the output inverters 475 included in the glitch filtering module 47 are not limited.

After receiving the filtered and converted pulse flt_Spul, the transmission gate 471a generates a glitch filtered signal Sgf1 as an intermediate stage signal. Then, the inverter 471c inverts the glitch filtered signal Sgf1 to generate an inverted signal Sinv1.

After receiving the inverted signal Sinv1, the transmission gate 473a generates a glitch filtered signal Sgf2 as an intermediate stage signal. Then, the inverter 473c inverts the glitch filtered signal Sgf2 to generate an inverted signal Sinv2.

The inverted signal Sinv2 is further inverted by the output inverter 475 to generate the detected signal Sdet. A waveform diagram listing these signals demonstrates the relationships between these signals and the glitch removing effects of the glitch filters 471, 473.

Figure 6B:
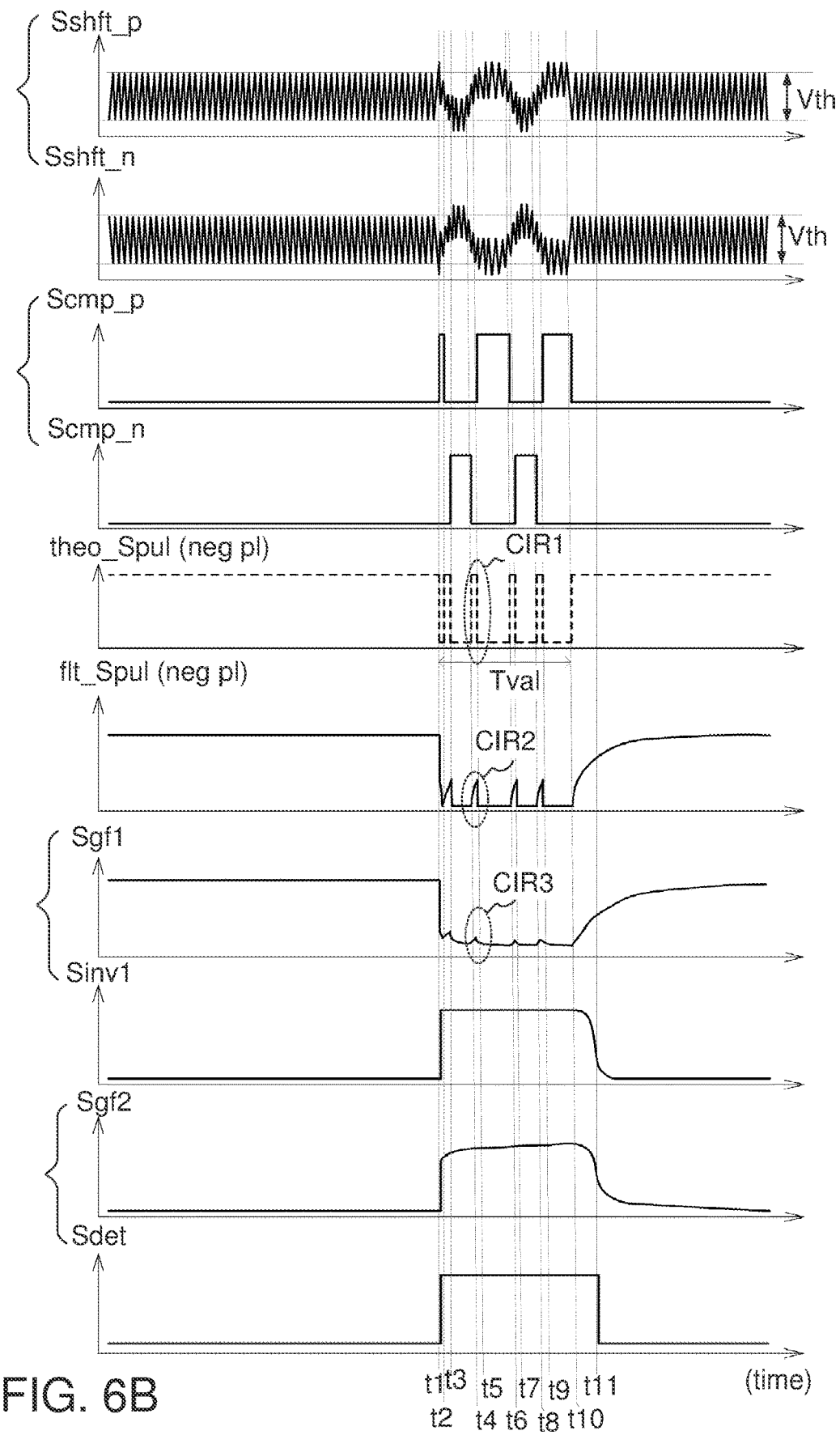
FIG. 6B is a waveform diagram illustrating the signals related to the serial signal detector in FIG. 6A.

FIG. 6B is a waveform diagram illustrating the signals related to the serial signal detector in FIG. 6A. Please refer to FIGS. 6A and 6B together. From top to down, the waveforms in FIG. 6B respectively correspond to the positive shifted signal Sshft_p, the negative shifted signal Sshft_n, the positive comparison signal Scmp_p, the negative comparison signal Scmp_n, a theoretical converted pulse theo_Spul, a filtered and converted pulse flt_Spul, the glitch filtered signal Sgf1, the inverted signal Sinv1, the glitch filtered signal Sgf2, and the detected signal Sdet.

Please refer to the first waveform (positive shifted signal Sshft_p), the second waveform (negative shifted signal Sshft_n), and the third waveform (positive comparison signal Scmp_p) together. In an ideal case, the positive comparison signal Scmp_p should be immediately set to the high level (Scmp_p=H) when the positive-path comparison condition is satisfied (ΔVshft_pn)>Vth), or immediately set to the low level (Scmp_p=L) when the positive-path comparison condition is not satisfied (ΔVshft_pn Vth). However, in practical circuits, the time point when the positive comparison signal Scmp_p is actually generated might be slightly later than the time point when satisfaction of the positive-path comparison condition is determined.

Please refer to the first waveform (positive shifted signal Sshft_p), the second waveform (negative shifted signal Sshft_n), and the fourth waveform (negative comparison signal Scmp_n) together. In an ideal case, the negative comparison signal Scmp_n should be immediately set to the high level (Scmp_n=H) when the negative-path comparison condition is satisfied (ΔVshft_np)>Vth), or immediately set to the low level (Scmp_n=14 when the negative-path comparison condition is not satisfied (ΔVshft_np Vth). However, in practical circuits, the time point when the negative comparison signal Scmp_n is actually generated might be slightly later than the time point when satisfaction of the negative-path comparison condition is determined.

As the hybrid logic filter 45 provides a NOR operation, the supply voltage Vdd is conducted to the pulse conversion terminal Ncnv (theoretical converted pulse theo_Spul=Vdd) when both the positive comparison signal Scmp_p and the negative comparison signal Scmp_n are set to the low level (Scmp_p=Scmp_n=L). The ground voltage Gnd is conducted to the pulse conversion terminal Ncnv (theoretical converted pulse theo_Spul=Gnd) when at least one of the positive comparison signal Scmp_p and the negative comparison signal Scmp_n is set to the high level (Scmp_p=H and/or Scmp_n=H). The theoretical converted pulse theo_Spul is shown in dotted line to represent the filtered and converted pulse under the circumstance that the hybrid logic filter 45 is without the programmable resistor Rp and the capacitor C. On the other hand, the filtered and converted pulse flt_Spul is generated at the pulse conversion terminal Ncnv, by the hybrid logic filter 45 having the programmable resistor Rp and the capacitor C.

Detailed relationships about variations of the positive comparison signal Scmp_p, the negative comparison signal Scmp_n, and the theoretical converted pulse theo_Spul are not described but listed. In Table 5, states of the negative comparison signal Scmp_n and the theoretical converted pulse theo_Spul in different durations are listed chronologically.

TABLE 5

| duration | positive comparison signal Scmp_p | negative comparison signal Scmp_n | theoretical converted pulse theo_Spul | type of duration |
|---|---|---|---|---|
| before t1 | L | L | H (Vdd) | nonvalid signal duration |
| t1-t2 | H | L | L (Gnd) | valid signal duration |
| t2-t3 | L | L | H (Vdd) | |
| t3-t4 | L | H | L (Gnd) | |
| t4-t5 | L | L | H (Vdd) | |
| t5-t6 | H | L | L (Gnd) | |
| t6-t7 | L | L | H (Vdd) | |
| t7-t8 | L | H | L (Gnd) | |
| t8-t9 | L | L | H (Vdd) | |
| t9-t10 | H | L | L (Gnd) | |
| t10-t11 | L | L | H (Vdd) | nonvalid signal duration |
| after t11 | L | L | H (Vdd) | |

As shown in FIG. 6B, the theoretical converted pulse theo_Spul maintains at the supply voltage Vdd before time point t1 and after time point t10. Moreover, the ground voltage Gnd is conducted to the pulse conversion terminal Ncnv (theoretical converted pulse theo_Spul=Gnd) in most of the duration between time point t1 and time point t10. That is, the pulse conversion terminal Ncnv is set to the ground voltage Gnd (theoretical converted pulse theo_Spul=Gnd) in most of the duration between time point t1 and time point t10 except that the pulse conversion terminal Ncnv is set to the supply voltage Vdd (theoretical converted pulse theo_Spul=Vdd) in some short durations (t2~t3, t4~t5, t6~t7, t8~t9).

By neglecting the variations of the theoretical converted pulse theo_Spul in the short durations (t2~t3, t4~t5, t6~t7, t8~t9), the waveform of the theoretical converted pulse theo_Spul can be considered as a negative pulse having a pulse duration between time point t1 to time point t10. In FIG. 6B, the pulse duration corresponding to the negative pulse (time point t1 to time point t10) is defined as a valid signal duration Tval.

For the sake of illustration, the short durations (t2~t3, t4~t5, t6~t7, t8~t9) within the valid signal duration Tval are defined as gap durations, during which the negative pulse of the theoretical converted pulse theo_Spul is interrupted (theoretical converted pulse theo_Spul changes from the ground voltage Gnd to the supply voltage Vdd). The potential causes of the gap durations (t2~t3, t4~t5, t6~t7, t8~t9) are briefly illustrated below.

As illustrated above, there are time differences between the time points when the comparators 431, 433 actually generate the positive comparison signal Scmp_p and the negative comparison signal Scmp_n and the time points when the positive-path comparison condition and the negative-path comparison condition are satisfied. Therefore, one of the cause that the gap durations (t2~t3, t4~t5, t6~t7, t8~t9) exist is that, there is delay in the circuit of the comparators 431, 433. Moreover, the delay in the comparators 431, 433 implies that the comparators 431, 433 are incapable of react the comparison results of the positive-path comparison condition and the negative-path comparison condition in a real-time manner.

Moreover, the comparison between the positive shifted signals Sshft_p and the negative shifted signals Sshft_n in FIGS. 5 and 6B demonstrate that, the positive shifted signal Sshft_p and the negative shifted signal Sshft_n in FIG. 5 are smooth, but the positive shifted signal Sshft_p and the negative shifted signal Sshft_n in FIG. 6B are not. Instead, the positive shifted signal Sshft_p and the negative shifted signal Sshft_n in FIG. 6B have shakes. These shakes might originate from the noise in the signal channel. Because of the noise, the existence of the sake phenomenon results in errors of the determination results of the comparators 431, 433. Consequentially, the theoretical converted pulse theo_Spul changes in the gap durations (t2~t3, t4~t5, t6~t7, t8~t9).

As illustrated above, assuming that considering the duration between time point t1 to time point t10 as a pulse duration corresponding to the negative pulse of the theoretical converted pulse theo_Spul, the negative pulse is interrupted by the several gap durations (t2~t3, t4~t5, t6~t7, t8~t9), which are side effects of the non-ideal characteristics such as the circuit delay of the comparators and the signal shakes caused by the noise. To ease the interruption phenomenon within the pulse duration, the programmable resistor Rp and the capacitor C are placed in the hybrid logic filter 45.

Please compare the theoretical converted pulse theo_Spul and the filtered and converted pulse flt_Spul. Although the filtered and converted pulse flt_Spul also varies during the gap durations (t2~t3, t4~t5, t6~t7, t8~t9), its variations are much smaller than the variations of theoretical converted pulse theo_Spul. Accordingly, combination and placement of the programmable resistor Rp and the capacitor C can be considered as providing low pass filtering function because the amplitude of the signal variation at the pulse conversion terminal Ncnv is depressed.

In FIG. 6B, dotted circles CIR1, CIR2, CIR3, respectively corresponding to the theoretical converted pulse theo_Spul, the filtered and converted pulse flt_Spul, and the glitch filtered signal Sgfl during the gap duration (time point t4 to time point t5), are labeled.

The waveforms of the theoretical converted pulse theo_Spul and the filtered and converted pulse flt_Spul are compared. Please compare the dotted circles CIR1, CIR2 together. During the gap duration (time point t4 to time point t5), the theoretical converted pulse theo_Spul is set to the supply voltage Vdd. On the other hand, the filtered and converted pulse flt_Spul is incapable of reaching the supply voltage Vdd between time point t4 to time point t5. Instead, the filtered and converted pulse flt_Spul is much lower than the theoretical converted pulse theo_Spul between time point t4 to time point t5.

That is, in the case the programmable resistor Rp and the capacitor C are excluded, the theoretical converted pulse theo_Spul quickly rises from the ground voltage Gnd to the supply voltage Vdd at time point t4 and falls from the supply voltage Vdd to the ground voltage Gnd at time point t5. However, if the hybrid logic filter 45 includes the programmable resistor Rp and the capacitor C, the conduction speed between the supply voltage terminal Vdd and the pulse conversion terminal Ncnv is significantly affected by the programmable resistor Rp. In the specification, the feature that the programmable resistor Rp slows down the conduction speed is utilized to depress the glitches in the valid signal duration Tval.

Because the gap duration (t4~t5) is very short and the rising speed of the filtered and converted pulse flt_Spul is dragged by the programmable resistor Rp, the filtered and converted pulse flt_Spul cannot rise to the supply voltage Vdd before time point t5. Thus, the filtered and converted pulse flt_Spul can quickly drop to the ground voltage Gnd at time point t5 because the filtered and converted pulse flt_Spul does not rise to the supply voltage Vdd as the theoretical converted pulse theo_Spul does.

In short, the theoretical converted pulse theo_Spul includes a series of short-term pulses in the valid signal duration Tval. Moreover, these short-term pulses are filtered and transformed into fragile and incomplete glitches in the filtered and converted pulse flt_Spul once the programmable resistor Rp and the capacitor C are adopted.

Similar to the filtered and converted pulse flt_Spul, the glitch filtered signal Sgf1 has a negative pulse. Please compare the waveforms in the dotted circles CIR2, CIR3. The glitch of the filtered and converted pulse flt_Spul in the dotted circle CIR2 is higher than the glitch of the glitch filtered signal Sgf1 in the dotted circle CIR3. Alternatively, the amplitude variation of the glitch filtered signal Sgf1 is lower than that of the filtered and converted pulse flt_Spul.

The transmission gate 471a includes a PMOS transistor and an NMOS transistor, and both are controlled with the filtered and converted pulse flt_Spul. When the supply voltage Vdd is conducted to the pulse conversion terminal Ncnv (filtered and converted pulse flt_Spul=Vdd), the NMOS transistor in the transmission gate 471a operates in the linear operation region and provides a low impedance path to generate the glitch filtered signal Sgf1 quickly. Or, when the ground voltage Gnd is conducted to the pulse conversion terminal Ncnv (filtered and converted pulse flt_Spul=Gnd), the PMOS transistor in the transmission gate 471a operates in the linear operation region and provides a low impedance path so that the glitch filtered signal Sgf1 can be quickly generated.

However, when the filtered and converted pulse flt_Spul is set to the intermediate voltage Vm during the gap durations, the PMOS transistor and the NMOS transistor in the transmission gate 471a operate in the saturation operation region, and the transmission gate 471a provides a high impedance path. As the filtered and converted pulse flt_Spul (input of the transmission gate 471a) is set to the intermediate voltage Vm during the gap durations, the glitches of the glitch filtered signal Sgf1 (output of the transmission gate 471a) are suppressed, and changes of the glitch filtered signal Sgf1 are relatively smaller than changes of the glitch filtered signal Sgf1. Therefore, compared with the filtered and converted pulse flt_Spul during the valid signal duration Tval, the glitch filtered signal Sgf1 during the valid signal duration Tval is smoother.

The waveforms of the filtered and converted pulse flt_Spul, the glitch filtered signal Sgf1, and the inverted signal Sinv are compared. As illustrated above, the transmission gate 471a further suppresses the glitches in the filtered and converted pulse flt_Spul to generate the glitch filtered signal Sgf1. After that, the inverter 471c inverts the glitch filtered signal Sgf1 to generate the inverted signal Sinv1. Thus, the glitch filtered signal Sgf1 and the inverted signal Sinv1 have opposite levels, and the inverted signal Sinv1 has a positive pulse. The glitches of the glitch filtered signal Sgf1 are further filtered by the inverter 471c, so the inverted signal Sinv1 during the valid signal duration Tval is roughly equivalent to the supply voltage Vdd.

The glitches are undesired phenomena, and the glitch filters 471, 473 are utilized to eliminate the glitches gradually. The glitch filters 471, 473 have similar designs, and the number of glitch filters in the glitch filtering module 47 is not limited. The waveforms in FIG. 6B demonstrate that during time point t1 and t11, the positive pulse of the glitch filtered signal Sgf2 is smoother than the positive pulse of the inverted signal Sinv1, and the detected signal Sdet is smoother than the glitch filtered signal Sgf2. The detected signal Sdet has a positive pulse. The rising and falling edges of the positive pulse of the detected signal Sdet are sharp, so the detected signal Sdet is adequate for digital usages.

The duration between time point t10 to time point t11 is considered as a transition duration. This duration corresponds to a signal to no signal (or loss of signal) transition. After time point t11, the waveform relationships are similar to those illustrated above, so the details are omitted.

Figure 7A:
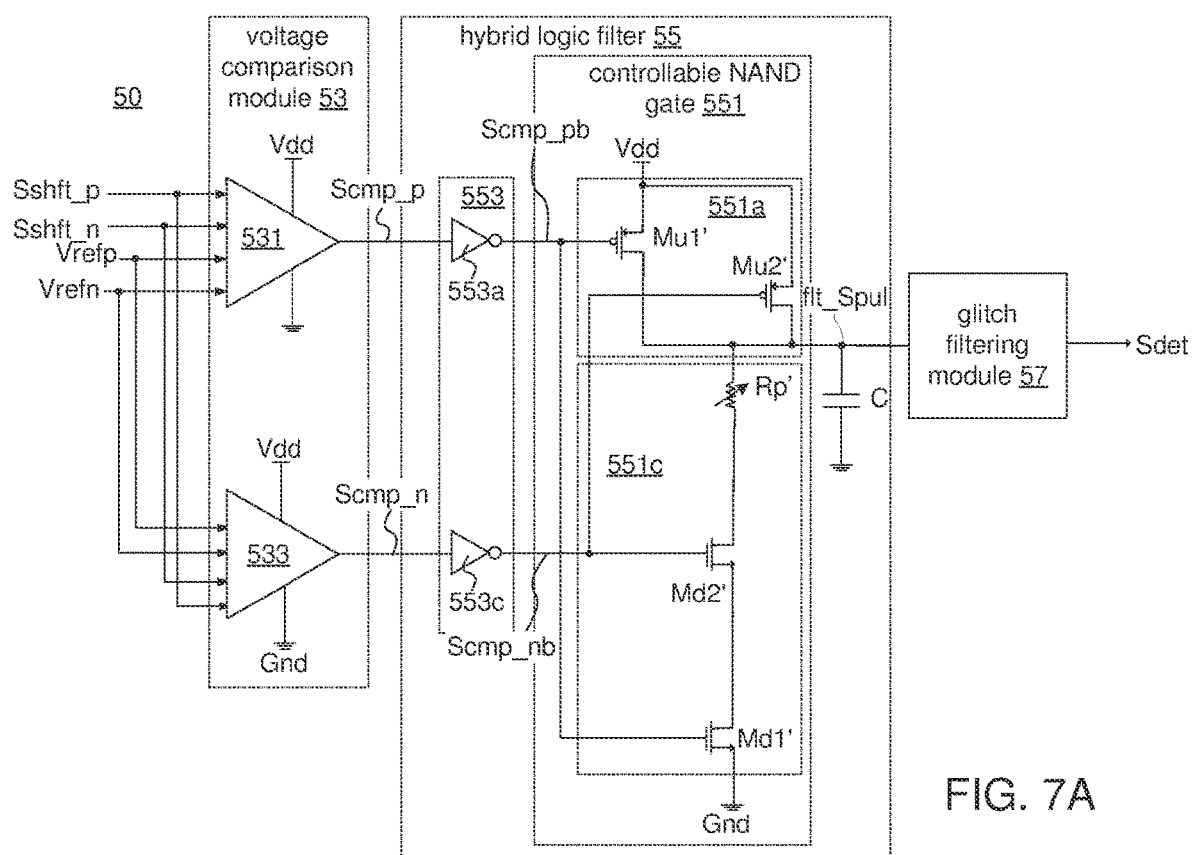
FIG. 7A is a schematic diagram illustrating another embodiment of the serial signal detector.

FIG. 7A is a schematic diagram illustrating another embodiment of the serial signal detector. Similar to FIG. 6, the serial signal detector 50 includes a voltage comparison module 53, a hybrid logic filter 55, and a glitch filtering module 57.

In FIG. 7A, the voltage comparison module 53 includes comparators 531, 533, and the hybrid logic filter 55 includes an input circuit 553, a controllable NAND gate 551, and a capacitor C. The input circuit 553 includes input inverters 553a, 553c. The input inverter 553a converts the positive comparison signal Scmp_p to a complement positive comparison signal Scmp_pb, and the input inverter 553c converts the negative comparison signal Scmp_n to a complement negative comparison signal Scmp_nb.

The controllable NAND gate 551 further includes a pull-up circuit 551a and a pull-down circuit 551c. The pull-up circuit 551a provides a pull-up path, and the pull-down circuit 551c provides a pull-down path. Both the pull-up circuit 551a and the pull-down circuit 551c are simultaneously electrically connected to the input inverters 553a, 553c. The pull-up circuit 551a includes PMOS transistors (pull-up transistors) Mu1', Mu2', and the pull-down circuit 551c includes a programmable resistor Rp' and NMOS transistors (pull-down transistors) Md1', Md2'.

In the pull-up circuit 551a, the source terminals of the PMOS transistors Mu1', Mu2' are electrically connected to the supply voltage terminal (Vdd), and the drain terminals of the PMOS transistors Mu1', Mu2' are electrically connected to the programmable resistor Rp'. The gate terminals of the PMOS transistors Mu1', Mu2' are respectively electrically connected to the input inverters 553a, 553c. The PMOS transistor Mu1' is controlled by the complement positive comparison signal Scmp_pb, the output of the input inverter 553a. The PMOS transistor Mu2' is controlled by the complement negative comparison signal Scmp_nb, the output of the input inverter 553c.

As the PMOS transistors Mu1' and Mu2' are connected in parallel, the filtered and converted pulse flt_Spul is pulled to the supply voltage Vdd when any PMOS transistors Mu1', Mu2' is switched on. When both the PMOS transistors Mu1', Mu2' are switched off, the pull-up path is disconnected, and the filtered and converted pulse flt_Spul is determined by the pull-down path.

In the pull-down circuit 551c, the source terminal of NMOS transistor Md1' is electrically connected to the ground terminal Gnd, and the drain terminal of NMOS transistor Md1' is electrically connected to the source terminal of NMOS transistor Md2'. The drain terminal of NMOS transistor Md2' is electrically connected to the programmable resistor Rp'. The programmable resistor Rp' is electrically connected to the pull-up circuit 551a, the capacitor C, and the glitch filtering module 57. The gate terminals of the NMOS transistors Md1', Md2' are respectively electrically connected to the input inverters 553a, 553c. The NMOS transistor Md1' is controlled by the complement positive comparison signal Scmp_pb, the output of the input inverter 553a. The gate terminal of NMOS transistor Md2' is controlled by the complement negative comparison signal Scmp_nb, the output of the input inverter 553c.

As the NMOS transistors Md1', Md2' are connected in serial, the filtered and converted pulse flt_Spul is pulled to the ground voltage Gnd if the positive comparison signal Scmp_p and the negative comparison signal Scm_n are set to the low level (Scmp_p=Scmp_n=L). On the other hand, the filtered and converted pulse flt_Spul is pulled to the supply voltage Vdd if any of the positive comparison signal Scmp_p and the negative comparison signal Scm_n is set to the high level (Scmp_p=H and/or Scmp_n=H). Therefore, the input inverters 553a, 553c, PMOS transistors Mu1', Mu2' and the NMOS transistors Md1', Md2' jointly provide an OR operation to the positive comparison signal Scmp_p and the negative comparison signal Scmp_n.

Table 6 summarizes the operations related to the hybrid logic filter 55.

forms of the positive shifted signal Sshft_p, the negative shifted signal Sshft_n, the positive comparison signal Scmp_p, and the negative comparison signal Scmp_n are identical to those in FIG. 7A.

As the combination of the input inverters 553a, 553c, and the controllable NAND gate 551 jointly provide an OR operation, the filtered and converted pulse flt_Spul has a positive pulse. Accordingly, the waveforms of the filtered and converted pulse flt_Spul, the glitch filtered signal Sgf1, the inverted signal Sinv1, the glitch filtered signal Sgf2, and the detected signal Sdet are opposite to those in FIG. 6B.

As mentioned in Table 1, the selections of the predefined levels of the positive comparison signal Scmp_p and the negative comparison signal Scmp_n are dependent on practical applications. FIGS. 8A, 8B, 9A, and 9B demonstrate embodiments in which the predefined levels of the positive comparison signal Scmp_p' and the negative comparison signal Scmp_n' are opposite to those in FIGS. 6A, 6B, 7A, and 7B.

FIG. 8A is a schematic diagram illustrating an exemplary hybrid logic filter. The operations of the hybrid logic filter 75 can be concluded based on the above illustrations, so the details are omitted. In short, the input inverter 633a inverts the positive comparison signal Scmp_p' to the complement positive comparison signal Scmp_pb', and the input inverter 633c inverts the negative comparison signal Scmp_n' to the complement negative comparison signal Scmp_nb'. Then,

TABLE 6

| inputs of hybrid logic filter 55 | | inputs of controllable NAND gate 551 | | PMOS transistors in pull-up path | | NMOS transistors in pull-down path | | output of hybrid logic filter 55 | transistor related to flt_Spul |
|---|---|---|---|---|---|---|---|---|---|
| Scmp_p | Scmp_n | Scmp_pb | Scmp_nb | Mu1' | Mu2' | Md1' | Md2' | flt_Spul | |
| L | L | H | H | OFF | OFF | ON | ON | L (Gnd) | Md1' + Md2' |
| L | H | H | L | OFF | ON | ON | OFF | H (Vdd) | Mu2' |
| H | L | L | H | ON | OFF | OFF | ON | H (Vdd) | Mu1' |
| H | H | L | L | ON | ON | OFF | OFF | H (Vdd) | Mu1' + Mu2' |

Please note that the positive comparison signal Scmp_p and the negative comparison signal Scmp_n cannot be set to the high level (Scmp_p=Scmp_n=H) at the same time in practical applications because the positive-path comparison condition ($\Delta$Vshft_pn>Vth) and the negative-path comparison condition ($\Delta$Vshft_np>Vth) cannot be satisfied simultaneously based on their definitions.

Figure 7B:
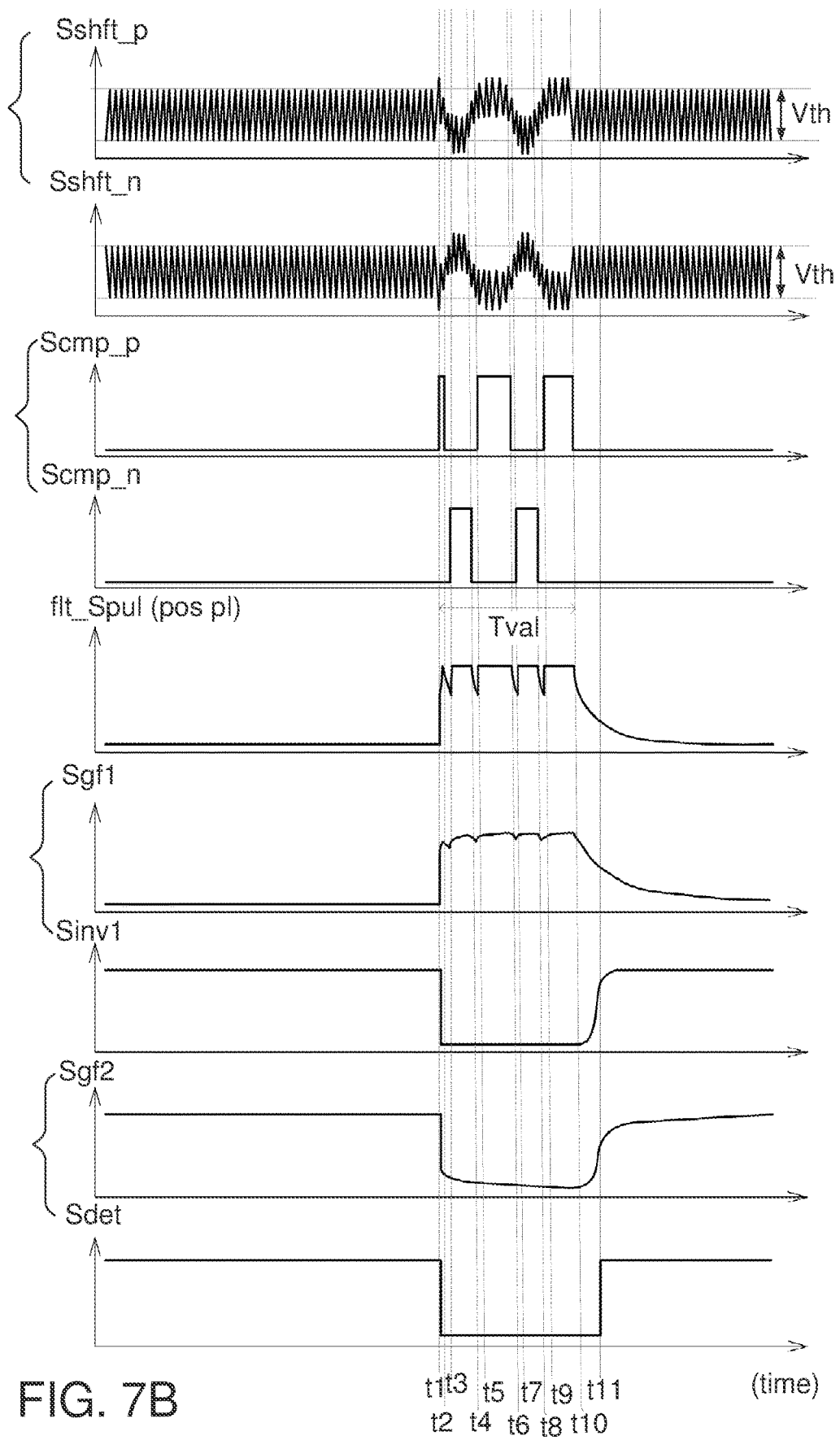
FIG. 7B is a waveform diagram illustrating the signals related to the serial signal detector in FIG. 7A.

FIG. 7B is a waveform diagram illustrating the signals related to the serial signal detector in FIG. 7A. The wavethe controllable NOR gate 451 performs a NOR operation to the complement positive comparison signal Scmp_pb' and the complement negative comparison signal Scmp_nb'. In a comprehensive view, the input inverters 633a, 633c and the controllable NOR gate 451 in the hybrid logic filter 65 collectively provide an AND operation to the positive comparison signal Scmp_p and the negative comparison signal Scmp_p. Table 7 summarizes the operations performed by the hybrid logic filter 65.

TABLE 7

| inputs of hybrid logic filter 65 | | inputs of controllable NOR gate 451 | | PMOS transistors in pull-up path | | NMOS transistors in pull-down path | | output of hybrid logic filter 65 | transistor related to flt_Spul |
|---|---|---|---|---|---|---|---|---|---|
| Scmp_p' | Scmp_n' | Scmp_pb' | Scmp_nb' | Mu1 | Mu2 | Md1 | Md2 | flt_Spul | |
| L | L | H | H | OFF | OFF | ON | ON | L (Gnd) | Md1 + Md2 |
| L | H | H | L | OFF | ON | ON | OFF | L (Gnd) | Md1 |
| H | L | L | H | ON | OFF | OFF | ON | L (Gnd) | Md2 |
| H | H | L | L | ON | ON | OFF | OFF | H (Vdd) | Mu1 + Mu2 |

FIG. 8B is a waveform diagram illustrating the signals related to the hybrid logic filter in FIG. 8A. In FIG. 8B, the waveforms of the positive shifted signal Sshft_p and the negative shifted signal Sshft_n are consistent with those in FIG. 6B, but the positive comparison signal Scmp_p' and the negative comparison signal Scmp_n' are opposite to those in FIG. 6B. In FIG. 8B, the filtered and converted pulse flt_Spul has a negative pulse as the hybrid logic filter 65 provides AND operation to the positive comparison signal Scmp_p and the negative comparison signal Scmp_n. As the glitches occur at the negative pulse, the programmable resistor Rp is placed at the pull-up path in FIG. 8A to slow down the pull-up speed of the glitches.

Figure 9A:
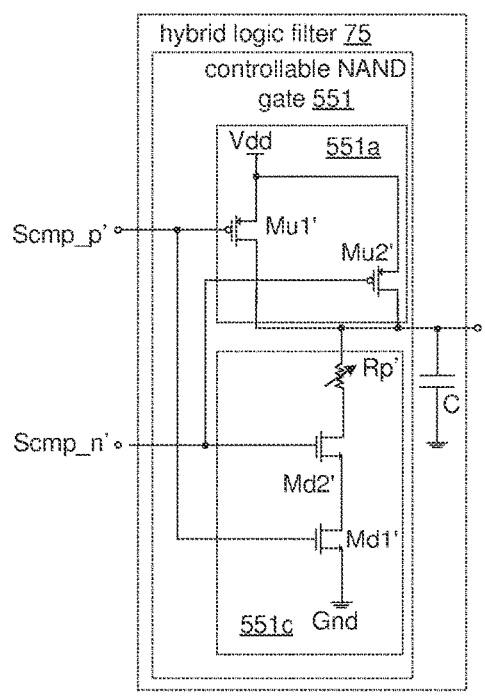
FIG. 9A is a schematic diagram illustrating another exemplary hybrid logic filter.

FIG. 9A is a schematic diagram illustrating another exemplary hybrid logic filter. The operations of the hybrid logic filter 75 can be concluded based on the above illustrations, so the details are omitted. In short, the hybrid logic filter 75 performs a NAND operation to the positive comparison signal Scmp_p' and the negative comparison signal Scmp_n'. Table 8 summarizes the operations performed by the hybrid logic filter 75.

TABLE 8

| inputs of hybrid logic filter 75 | | PMOS transistors in pull-up path | | NMOS transistors in pull-down path | | output of hybrid logic filter 75 | transistor related to |
|---|---|---|---|---|---|---|---|
| Scmp_p' | Scmp_n' | Mu1' | Mu2' | Md1' | Md2' | flt_Spul | flt_Spul |
| L | L | ON | ON | OFF | OFF | H (Vdd) | Mu1 + Mu2 |
| L | H | ON | OFF | OFF | ON | H (Vdd) | Mu1 |
| H | L | OFF | ON | ON | OFF | H (Vdd) | Mu2 |
| H | H | OFF | OFF | ON | ON | L (Gnd) | Md1 + Md2 |

Figure 9B:
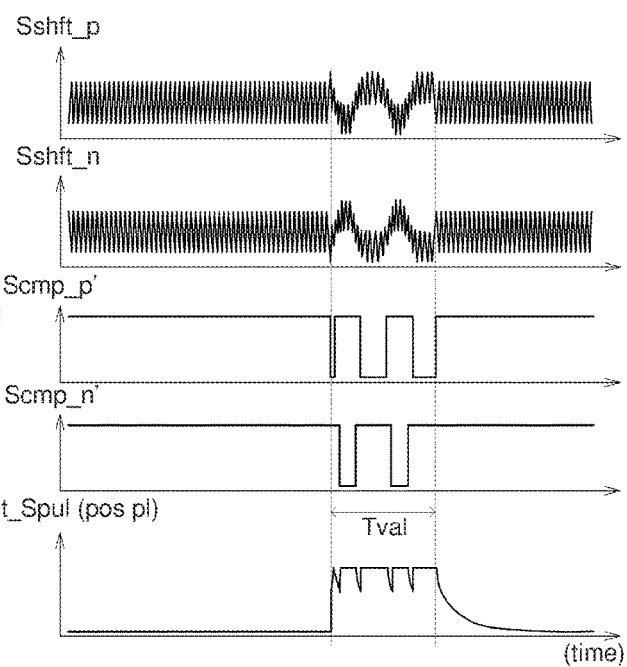
FIG. 9B is a waveform diagram illustrating the signals related to the hybrid logic filter in FIG. 9A.

FIG. 9B is a waveform diagram illustrating the signals related to the hybrid logic filter in FIG. 9A. In FIG. 9B, the waveforms of the positive shifted signal Sshft_p and the negative shifted signal Sshft_n are consistent with those in FIG. 7B, but the positive comparison signal Scmp_p and the negative comparison signal Scmp_n are opposite to those in FIG. 7B. In FIG. 9B, the filtered and converted pulse flt_Spul has a positive pulse. As the glitches occur at the positive pulse, the programmable resistor Rp is placed at the pull-down path to slow down the pull-down speed of the glitches.

Based on the above illustrations, the design and the logic operation provided by the hybrid logic filter can be freely designed. Table 9 briefly summarizes the above embodiments.

TABLE 9

| FIG. | logic operation of hybrid logic filter | Input of hybrid logic filter | component | pulse type of flt_Spul | position of programmable resistor Rp/Rp' |
|---|---|---|---|---|---|
| FIGS. 6A, 6B | NOR | Scmp_p, Scmp_n | controllable NOR gate 451 | negative pulse | pull-up path |
| FIGS. 7A, 7B | OR | | input inverters 533a, 533c, and controllable NAND gate 551 | positive pulse | pull-down path |

TABLE 9-continued

| FIG. | logic operation of hybrid logic filter | Input of hybrid logic filter | component | pulse type of flt_Spul | position of programmable resistor Rp/Rp' |
|---|---|---|---|---|---|
| FIGS. 8A, 8B | AND | Scmp_p', Scmp_n' | input inverters 633a, 633b and controllable NOR gate 451 | negative pulse | pull-up path |
| FIGS. 9A, 9B | NAND | | controllable NAND gate 551 | positive pulse | pull-down path |

When the filtered and converted pulse flt_Spul has a negative pulse(s) (FIGS. 6B and 8B), the programmable resistor Rp is placed at the pull-up path (FIGS. 6A and 8A) to drag the rising speed of the glitches of the filtered and converted pulse flt_Spul. By placing the programmable resistor Rp at the pull-up path, the plural upward glitches during the valid signal duration Tval can be suppressed.

When the filtered and converted pulse flt_Spul has a positive pulse(s) (FIGS. 7B and 9B), the programmable resistor Rp is placed at the pull-down path (FIGS. 7A and 9A) to drag the dropping speed of the glitches of the filtered and converted pulse flt_Spul. By placing the programmable resistor Rp at the pull-down path, the plural downward glitches during the valid signal duration Tval can be suppressed.

As the internal settings of the level shifter, the reference voltage providing circuit, the comparators, and the controllable logic gate can be freely selected, the serial signal detector can be dynamically set to detect different types of serial input signals, depending on the setting of the protocol selection signal Spsel. Based on such design, the serial signal detector, according to the embodiment of the present disclosure, can be flexibly applied to different types of serial communication protocols, for example, PCIe Squelch detection, SATA OOB detection, USB LFPS detection, Ethernet LOS detection, and so forth.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A serial signal detector, comprising:
a voltage comparison module, configured to receive a pair of differential signals comprising a first shifted signal and a second shifted signal, wherein the voltage comparison module comprises:

a first comparator, configured to generate a first comparison signal based on the first shifted signal, the second shifted signal, and a voltage threshold; and a second comparator, configured to generate a second comparison signal based on the first shifted signal, the second shifted signal, and the voltage threshold; and a hybrid logic filter, electrically connected to the first comparator and the second comparator, comprising:

a controllable logic gate, configured to generate a filtered and converted pulse at a pulse conversion terminal in response to a logic operation, wherein the logic operation is related to the first comparison signal and the second comparison signal; and a capacitor, electrically connected to the pulse conversion terminal, wherein the controllable logic gate and the capacitor jointly perform a preliminary filtering operation to the filtered and converted pulse while the logic operation is being performed.

2. The serial signal detector according to claim 1, wherein the logic operation is a NOR operation, a NAND operation, an AND operation, or an OR operation.

3. The serial signal detector according to claim 1, wherein the controllable logic gate comprises:

a pull-up circuit, electrically connected to the pulse conversion terminal and a supply voltage terminal having a supply voltage, configured to selectively conduct the supply voltage to the pulse conversion terminal; and a pull-down circuit, electrically connected to the pulse conversion terminal and a ground terminal having a ground voltage, configured to selectively conduct the ground voltage to the pulse conversion terminal, wherein the supply voltage is higher than the ground voltage, and the pull-up circuit and the pull-down circuit are alternatively switched on in response to the first comparison signal and second comparison signal.

4. The serial signal detector according to claim 3, wherein the pull-up circuit comprises:

a first pull-up transistor, comprising:

a first terminal, a second terminal, and a control terminal, wherein the first terminal of the first pull-up transistor is electrically connected to the supply voltage terminal, and the first pull-up transistor is selectively switched on in response to the first comparison signal; and a second pull-up transistor, comprising:

a first terminal, a second terminal, and a control terminal, wherein the second pull-up transistor is selectively switched on in response to the second comparison signal.

5. The serial signal detector according to claim 4, wherein the second terminal of the first pull-up transistor is electrically connected to the first terminal of the second pull-up transistor, wherein the pull-up circuit conducts the supply voltage to the pulse conversion terminal when the first pull-up transistor and the second pull-up transistor are both switched on, and the pull-down circuit conducts the ground voltage to the pulse conversion terminal when at least one of the first pull-up transistor and the second pull-up transistor is switched off.

6. The serial signal detector according to claim 5, wherein the pull-up circuit further comprises:

a resistor, comprising a first terminal and a second terminal, wherein the first terminal of the resistor is electrically connected to the second terminal of the second pull-up transistor, and the second terminal of the resistor is electrically connected to the pulse conversion terminal.

7. The serial signal detector according to claim 6, wherein a resistance value of the resistor is adjusted in response to a protocol selection signal representing one of universal serial bus (hereinafter, USB) protocol, serial advanced technology attachment (hereinafter, SATA) protocol, peripheral component interconnect express (hereinafter, PCIe) protocol and Ethernet protocol.

8. The serial signal detector according to claim 4, wherein the second terminal of the first pull-up transistor is electrically connected to the pulse conversion terminal, and the first terminal and the second terminal of the second pull-up transistor are respectively electrically connected to the supply voltage terminal and the pulse conversion terminal, wherein the pull-up circuit conducts the supply voltage to the pulse conversion terminal when at least one of the first pull-up transistor and the second pull-up transistor is switched on, and the pull-down circuit conducts the ground voltage to the pulse conversion terminal when the first pull-up transistor and the second pull-up transistor are both switched off.

9. The serial signal detector according to claim 4, wherein the hybrid logic filter further comprises:

a first input inverter, electrically connected to the first comparator and the control terminal of the first pull-up transistor, configured to invert the first comparison signal to a first complement comparison signal and transmit the first complement comparison signal to the first pull-up circuit; and a second input inverter, electrically connected to the second comparator and the control terminal of the second pull-up transistor, configured to invert the second comparison signal to a second complement comparison signal and transmit the second complement comparison signal to the second pull-up transistor.

10. The serial signal detector according to claim 3, wherein the pull-down circuit comprises:

a first pull-down transistor, comprising:

a first terminal, a second terminal, and a control terminal, wherein the first terminal of the first pull-down transistor is electrically connected to the ground terminal, and the first pull-down transistor is selectively switched on in response to the first comparison signal; and a second pull-down transistor, comprising:

a first terminal, a second terminal, and a control terminal, wherein the second pull-down transistor is selectively switched on in response to the second comparison signal.

11. The serial signal detector according to claim 10, wherein the second terminal of the first pull-down transistor is electrically connected to the pulse conversion terminal, and the first terminal and the second terminal of the second pull-down transistor are respectively electrically connected to the ground terminal and the pulse conversion terminal, wherein the pull-up circuit conducts the supply voltage to the pulse conversion terminal when the first pull-down transistor and the second pull-down transistor are both switched off, and the pull-down circuit conducts the ground voltage to the pulse conversion terminal when at least one of the first pull-down and the second pull-down transistor is switched on.

12. The serial signal detector according to claim 10, wherein the second terminal of the first pull-down transistor is electrically connected to the first terminal of the second pull-down transistor, wherein the pull-up circuit conducts the supply voltage to the pulse conversion terminal when at least one of the first pull-down and the second pull-down transistor is switched off, and the pull-down circuit conducts the ground voltage to the pulse conversion terminal when the first pull-down transistor and the second pull-down transistor are both switched on.

13. The serial signal detector according to claim 12, wherein the pull-down circuit further comprises:

a resistor, comprising a first terminal and a second terminal, wherein the first terminal of the resistor is electrically connected to the second terminal of the second pull-down transistor, and the second terminal of the resistor is electrically connected to the pulse conversion terminal.

14. The serial signal detector according to claim 13, wherein a resistance value of the resistor is adjusted in response to a protocol selection signal representing one of universal serial bus (hereinafter, USB) protocol, serial advanced technology attachment (hereinafter, SATA) protocol, peripheral component interconnect express (hereinafter, PCIe) protocol and Ethernet protocol.

15. The serial signal detector according to claim 10, wherein the hybrid logic filter further comprises:

a first input inverter, electrically connected to the first comparator and the control terminal of the first pull-down transistor, configured to invert the first comparison signal to a first complement comparison signal and transmit the first complement comparison signal to the first pull-down transistor; and a second input inverter, electrically connected to the second comparator and the control terminal of the second pull-down transistor, configured to invert the second comparison signal to a second complement comparison signal and transmit the second complement comparison signal to the second pull-down transistor.

16. The serial signal detector according to claim 1, further comprising:

a glitch filter, comprising:

a transmission gate, electrically connected to the pulse conversion terminal, configured to perform a secondary filtering operation to the filtered and converted pulse and accordingly generate a glitch filtered signal; and an inverter, electrically connected to the transmission gate, configured to generate a first inverted signal by inverting the glitch filtered signal.

17. The serial signal detector according to claim 1, wherein the voltage threshold is a voltage difference between a first reference voltage and a second reference voltage, wherein the first reference voltage and the second reference voltage are direct current voltages, and the first reference voltage is higher than the second reference voltage.

18. The serial signal detector according to claim 17, wherein the first comparator receives the first shifted signal, the second shifted signal, the first reference voltage, and the second reference voltage, wherein the first comparator sets the first comparison signal to a first level when a voltage difference between the first shifted signal and the second shifted signal is greater than the voltage threshold, and the first comparator sets the first comparison signal to a second level when the voltage difference between the first shifted signal and the second shifted signal is smaller than or equivalent to the voltage threshold.

19. The serial signal detector according to claim 17, wherein the second comparator receives the first shifted signal, the second shifted signal, the first reference voltage, and the second reference voltage, wherein the second comparator sets the second comparison signal to a first level when a voltage difference between the second shifted signal and the first shifted signal is greater than the voltage threshold, and the second comparator sets the second comparison signal to a second level when the voltage difference between the second shifted signal and the first shifted signal is smaller than or equivalent to the voltage threshold.

20. A differential signal detection method applied to a receiver, comprising steps of:

receiving a pair of differential signals comprising a first shifted signal and a second shifted signal;

generating a first comparison signal and a second comparison signal based on the first shifted signal, the second shifted signal, and a voltage threshold;

performing a logic operation related to the first comparison signal and the second comparison signal;

generating a filtered and converted pulse according to the logic operation; and performing a preliminary filtering operation to the filtered and converted pulse while the logic operation is being performed.

* * * * *